(12) United States Patent
Kim et al.

(10) Patent No.: US 10,256,435 B2
(45) Date of Patent: Apr. 9, 2019

(54) DISPLAY DEVICE

(71) Applicant: Samsung Display Co., Ltd., Yongin-si (KR)

(72) Inventors: Tae Woong Kim, Yongin-si (KR); Hyun Woo Koo, Yongin-si (KR); Jeong Ho Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/806,252

(22) Filed: Nov. 7, 2017

(65) Prior Publication Data

US 2018/0151835 A1 May 31, 2018

(30) Foreign Application Priority Data

Nov. 29, 2016 (KR) .................. 10-2016-0160803

(51) Int. Cl.
| | |
|---|---|
| *H01L 51/52* | (2006.01) |
| *H01L 27/15* | (2006.01) |
| *H01L 33/56* | (2010.01) |
| *H01L 51/00* | (2006.01) |
| H01L 27/32 | (2006.01) |

(52) U.S. Cl.
CPC .......... *H01L 51/5253* (2013.01); *H01L 27/15* (2013.01); *H01L 33/56* (2013.01); *H01L 51/0097* (2013.01); *H01L 27/3244* (2013.01); *H01L 2251/5338* (2013.01)

(58) Field of Classification Search
CPC ............. H01L 51/5237–51/5256; H01L 33/56
See application file for complete search history.

(56) References Cited

U.S. PATENT DOCUMENTS

| | | | |
|---|---|---|---|
| 5,654,084 A | 8/1997 | Egert | |
| 6,664,318 B1 * | 12/2003 | Bymark | C08L 101/02 |
| | | | 257/E23.119 |
| 9,054,340 B2 | 6/2015 | Kim | |
| 9,387,276 B2 | 7/2016 | Sun et al. | |
| 2012/0235207 A1 * | 9/2012 | Kwack | H01L 51/5253 |
| | | | 257/100 |

(Continued)

FOREIGN PATENT DOCUMENTS

| | | |
|---|---|---|
| KR | 10-2014-0060776 | 5/2014 |
| KR | 10-2015-0057160 | 5/2015 |

OTHER PUBLICATIONS

Jeong-Yun Sun et al., "Highly stretchable and tough hydrogels", Nature, Sep. 6, 2012, pp. 133-136, vol. 489, Macmillan Publishers Limited.

(Continued)

*Primary Examiner* — Selim U Ahmed
*Assistant Examiner* — Evan G Clinton
(74) *Attorney, Agent, or Firm* — H.C. Park & Associates, PLC

(57) ABSTRACT

A display device includes a substrate including a display area and a non-display area, a pixel part in the display area of the substrate to display an image, a first encapsulation layer disposed over and covering at least part of the pixel part, and a second encapsulation layer disposed over the first encapsulation layer and substantially covering the entire extent of the first encapsulation layer, wherein the second encapsulation layer comprises an interpenetrating polymer hydrogel.

21 Claims, 5 Drawing Sheets

(56) References Cited

U.S. PATENT DOCUMENTS

| | | | |
|---|---|---|---|
| 2014/0021499 A1* | 1/2014 | Jang | H01L 51/0097 |
| | | | 257/98 |
| 2015/0038613 A1* | 2/2015 | Sun | A61L 27/52 |
| | | | 523/113 |
| 2015/0140349 A1 | 5/2015 | Lee et al. | |
| 2016/0028043 A1* | 1/2016 | Kwon | H01L 51/5253 |
| | | | 257/40 |
| 2016/0124256 A1* | 5/2016 | Song | G02F 1/1341 |
| | | | 349/43 |
| 2016/0233453 A1* | 8/2016 | Lee | H01L 51/5256 |
| 2017/0187004 A1* | 6/2017 | Giraldo | H01L 51/5253 |
| 2017/0194566 A1* | 7/2017 | Goddard | H01L 51/0022 |
| 2017/0324065 A1* | 11/2017 | Lang | H01L 51/5268 |

OTHER PUBLICATIONS

Hyunwoo Yuk et al., "Tough bonding of hydrogels to diverse non-porous surfaces", Nature Materials, Nov. 9, 2015, pp. 1-9, Macmillan Publishers Limited.

* cited by examiner

DISPLAY DEVICE

CROSS-REFERENCE TO RELATED APPLICATION

This application claims priority from and the benefit of Korean Patent Application No. 10-2016-0160803, filed on Nov. 29, 2016, which is hereby incorporated by reference for all purposes as if fully set forth herein.

BACKGROUND

Field

The invention relates to a display device, and more particularly, to a rollable display device having a light emitting device, such as an OLED.

Discussion of the Background

An organic light emitting display device (OLED) is a self-luminance display device and does not require a separate light source. Therefore, the thickness of an OLED can be reduced as compared to other types of display devices.

Recently, there have been developed foldable or rollable display devices using flexible materials instead of inflexible substrates. When such a foldable or rollable display device is flexed, folded or rolled, stress may be applied to the display device, and this stress may cause defects in the display device.

The above information disclosed in this Background section is only for enhancement of understanding of the background of the inventive concepts, and, therefore, it may contain information that does not form the prior art that is already known in this country to a person of ordinary skill in the art.

SUMMARY

Flexible display devices constructed according to the principles of the invention reduce or eliminate defects caused by flexing, rolling or folding the display device. For example, Applicants discovered that when a flexible display device is rolled the shear strain on the inner layers of the rolled device is different from the shear strain on the outer layers of the device. The difference in shear strain between in the inner and outer layers produces stress that can cause the layers, particularly at the distal portion of the device, to separate. By forming a second encapsulation layer disposed over a first encapsulation layer and/or providing an elastic material between the two encapsulation layers, devices constructed according to the principles of the invention can prevent defects caused be external stress, such as interface separation of the internal layers of the device.

Additional aspects will be set forth in the detailed description which follows, and, in part, will be apparent from the disclosure, or may be learned by practice of the inventive concepts.

According to one aspect of the invention, a display device includes a substrate including a display area and a non-display area, a pixel part in the display area of the substrate configured to display an image, a first encapsulation layer disposed over and covering at least part of the pixel part, and a second encapsulation layer disposed over the first encapsulation layer and substantially covering the entire extent of the first encapsulation layer, wherein the second encapsulation layer comprises an interpenetrating polymer hydrogel.

The interpenetrating polymer hydrogel may include at least two of polyethylene glycol, neopentylglycol diacrylate, polyethylene oxide, polyacrylamide, polyhydroxyethylmethacrylate, polyacrylic acid, polyvinyl alcohol, poly(N-isopropylacrylamide), polyvinylpyrrolidone, polylactic acid, polyglycolic acid and polycaprolactone, gelatin, alginate, carrageenan, chitosan, hydroxyalkyl cellulose, alkyl cellulose, silicon, rubber, agar, carboxyvinyl copolymer, polydioxolane, polyacrylacetate, polyvinylchloride, and maleic anhydride/vinylether.

The interpenetrating polymer hydrogel may include polyacrylamide and alginate.

The display device may further include a first connection layer disposed between the first encapsulation layer and the second encapsulation layer, the first connection layer connecting the first encapsulation layer and the second encapsulation layer together.

The non-display area may include a first area in which the first encapsulation layer is disposed and a second area in which the first encapsulation layer is not disposed. The first connection layer may be disposed between the substrate and the second encapsulation layer in the second area.

The substrate may have opposed faces and the second encapsulation layer may extend over substantially the entire surface of one of the faces of the substrate.

The first connection layer may overlap with the second encapsulation layer and may have substantially the same size and shape as the second encapsulation layer.

The first connection layer may include an elastic adhesive. The elastic adhesive may include organopolysiloxane. The organopolysiloxane may be a polymer polymerized by 3-trimethoxysilylpropyl methacrylate as a monomer.

The display device may further include a buffer layer disposed between the substrate and the first connection layer.

The display device may further include a second connection layer disposed between the pixel part and the first encapsulation layer.

The first encapsulation layer may include a first sub-layer having an inorganic material, a second sub-layer having an organic material, and a third sub-layer having an inorganic material, which sub-layers are sequentially stacked.

The display device may further include a third connection layer provided between the first sub-layer and the second sub-layer and/or between the second sub-layer and the third sub-layer.

The display device may further include a third connection layer provided between at least one of the first sub-layer and the second sub-layer or between the second sub-layer and the third sub-layer.

At least a portion of the display device may have flexibility. At least a portion of the display device may be rollable. At least a portion of the display device may be foldable.

The pixel part may include a thin film transistor on the substrate, and a light emitting device connected to the thin film transistor.

The display device may further include a mid-layer disposed between the pixel part and the first encapsulation layer, the mid-layer comprising at least one of alkali metal salt and alkali earth metal salt.

The interpenetrating polymer hydrogel may have a toughness of about 5000 $J/m^2$ to about 12000 $J/m^2$.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concepts, and are incorporated in and constitute a part of this specification, illustrate exemplary embodiments of the inventive concepts, and, together with the description, serve to explain principles of the inventive concepts.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

Figure 1:
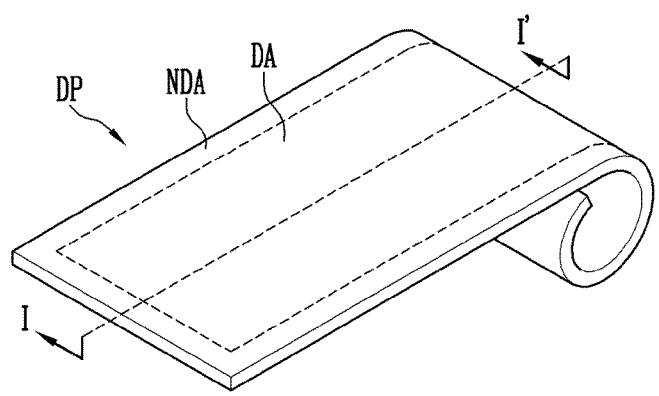
FIG. 1 is a perspective view of a first embodiment of a display panel constructed according to the principles of the invention.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or s addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Hereinafter, exemplary embodiments of the invention will be described in detail with reference to the accompanying drawings Referring to FIGS. 1 and 2, the first embodiment of the display device includes a display panel DP.

At least a portion of the display panel DP may be flexible, and the display panel DP may be flexed, rolled or folded at any portion thereof that is flexible. Accordingly, the display device DP can be used in various kinds of display devices, e.g., a rollable display device, a foldable display device, a flexible display device, and the like. FIG. 1 depicts the display device DP in a rollable display device, where a portion of the display panel DP is rolled.

The display panel DP includes a substrate SUB, a pixel part PXP provided on the substrate SUB, a cover layer CVL provided on the pixel part PXP, a first encapsulation layer SL1 provided over the cover layer CVL, a first connection layer CNL provided over the first encapsulation layer CNL1, and a second encapsulation layer SL2 covering the first encapsulation layer SL1.

Figure 2:
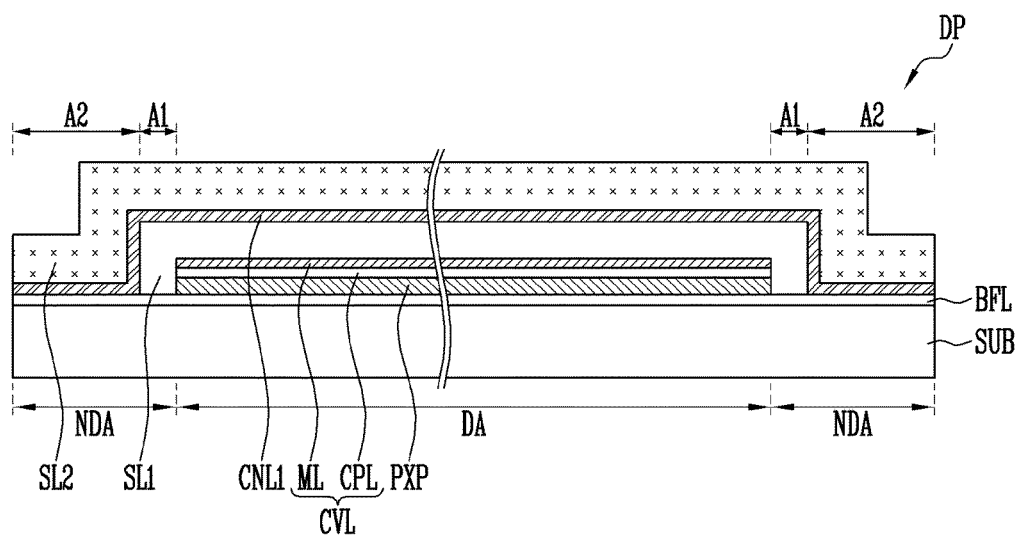
FIG. 2 is a sectional view taken along line I-I' of FIG. 1.

The substrate SUB includes a display area DA in which an image is displayed and a non-display area NDA provided beyond at least one side of the display area DA, such as surrounding the display area, as shown in FIG. 2.

The substrate SUB may have an approximately quadrangular shape such as a rectangular shape. However, the shape of the substrate SUB is not limited thereto, and the substrate SUB may have various other shapes. For example, the substrate SUB may be provided in various shapes such as a closed-shape polygon including linear sides, a circle, an ellipse, and other shapes including curved sides such as a semicircle, a semi-ellipse, and so on, as well as shapes including both linear and curved sides. When the substrate SUB has linear sides, at least one portion of corners of each of the shapes may be formed in a curve. For example, when the substrate SUB has a rectangular shape, a portion at which adjacent linear sides meet each other may be replaced with a curve having a predetermined curvature. That is, a vertex portion of the rectangular shape may be formed with a curved side having both adjacent ends respectively connected to two adjacent linear sides, the curved side having a predetermined curvature. The curvature may be different depending on a position. For example, the curvature may be changed depending on a position at which the curve is started, a length of the curve, and other factors or variables.

The display area DA is an area in which a plurality of pixels are provided to display an image. The display area DA may be provided in a shape corresponding to that of the substrate SUB. For example, like the shape of the substrate SUB, the display area DA may be provided in various shapes such as a closed-shape polygon including linear sides, a circle, an ellipse, and so on, including curved sides, and a semicircle, a semi-ellipse, or a shape including both linear and curved sides. When the display area DA has linear sides, at least a portion of corners of each of the shapes may be formed in a curve.

The substrate SUB may be made of an insulative material such as glass or resin. Also, the substrate SUB may be made of a material having flexibility to be bendable or foldable. The substrate SUB may have a single-layered structure or a multi-layered structure.

For example, the substrate SUB may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate. The material constituting the substrate SUB may be formed from these or other materials know in the art, such as fiber glass reinforced plastic (FRP), or the like.

A buffer layer BFL is formed on the substrate SUB. The buffer layer BFL prevents impurities from be diffused into the pixel part PXP. The buffer layer BFL may be provided in a single layer or in multiple layers.

The buffer layer BFL may be an inorganic insulating layer made of an inorganic material. For example, the buffer layer BFL may be formed of silicon nitride, silicon oxide, silicon oxynitride, aluminum oxide, aluminum nitride, titanium oxide, titanium nitride, or the like. The material of the buffer layer BFL is not limited thereto. For example, the buffer layer BFL may be an organic insulating layer made of an organic material. More specifically, the buffer layer BFL may be formed of polyimide, polyester, polyacryl, or the like. When the buffer layer BFL is provided in multiple layers, the layers may be formed of the same material, or may be formed of different materials. The buffer layer BFL may be omitted according to the material and process conditions of the substrate SUB.

The pixel part PXP includes a plurality of pixels, and is provided on the display area DA of the substrate SUB. The pixel is a minimum unit for displaying an image. Each pixel may emit white light and/or colored light. When each pixel emits colored light, each pixel may emit light of one of red, green, and blue. However, the disclosure is not limited to the foregoing examples. Thus, in a further example, each pixel may emit light of a color such as cyan, magenta, or yellow.

The pixels may be arranged in a matrix form along rows and columns. However, the arrangement form of the pixels is not particularly limited, and the pixels may be arranged in various other forms as well.

The pixel may be implemented as an organic light emitting device including an emitting layer. Alternatively, the pixel may be implemented in a liquid crystal device, an electrophoretic device, and an electrowetting device. In the following description, the pixel is described as a light emitting device for exemplary purposes.

Each pixel includes a thin film transistor and a light emitting device connected to the thin film transistor.

The thin film transistor controls the light emitting device. The pixel may include various numbers of thin film transistors. For example, one thin film transistor or three or more thin film transistors may be provided in one pixel. Thus, one pixel may be provided with seven thin film transistors or more.

The light emitting device includes an emitting layer, and two electrodes opposite to each other with the emitting layer interposed therebetween. The emitting layer emits or does not emit light according to an output signal of the thin film transistor. Thus, an image is displayed. The light emitted from the emitting layer may be changed depending on the material of the emitting layer. The light emitted from the emitting layer may be color light or white light.

Figure 3:
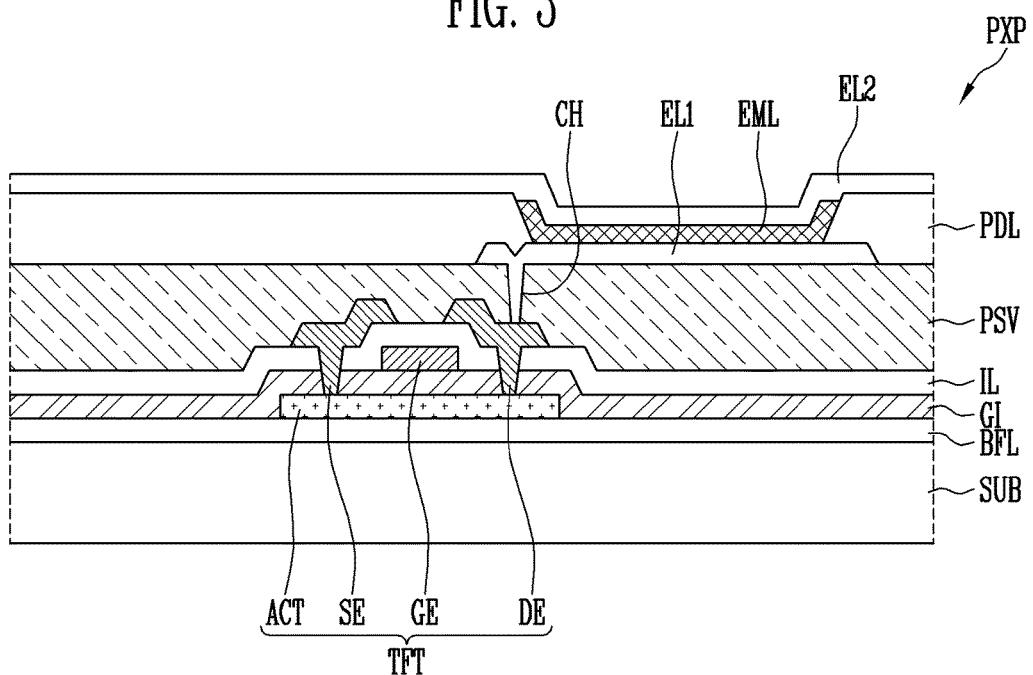
FIG. 3 is a cross sectional view of a pixel part of a display device constructed according to the principles of the invention.

Referring to FIG. 3, the buffer layer BFL is provided on the substrate SUB, and a thin film transistor TFT is provided on the buffer layer BFL. As shown, the thin film transistor TFT is implemented as a thin film transistor having a top gate structure. However, the thin film transistor TFT may be implemented in other ways known in the art, such as a thin film transistor having a bottom gate structure.

The thin film transistor TFT includes an active pattern ACT, a gate electrode GE, a source electrode SE, and a drain electrode DE.

The active pattern ACT is provided on the buffer layer BFL. The active pattern ACT is formed of a semiconductor material. The active pattern ACT may include a source region, a drain region, and a channel region provided between the source region and the drain region. The active pattern ACT may be a semiconductor pattern made of poly-silicon, amorphous silicon, semiconductor oxide, or the like. The channel region is a semiconductor pattern undoped with impurities, and may be an intrinsic semiconductor. The source region and the drain region may be semiconductor patterns doped with impurities. The impurities may be impurities such as an n-type impurity, a p-type impurity, and other metals.

A gate insulating layer GI is provided over the active pattern ACT. The gate insulating layer GI may be an inorganic insulating layer made of an inorganic material. Alternatively, the gate insulating layer GI may be an organic insulating layer made of an organic material. The inorganic material may include inorganic insulating materials such as polysiloxane, silicon nitride, silicon oxide, and silicon oxynitride. The organic material may include one or more organic insulating materials such as a polyacryl-based compound, a polyimide-based compound, a fluorine-based compound like Teflon™, a benzocyclobutene-based compound, and/or the like.

The gate electrode GE is provided on the gate insulating layer GI. The gate electrode GE is formed to cover a region corresponding to the channel region of the active pattern ACT.

The gate electrode GE may be made of a metal. For example, the gate electrode GE may be made of at least one of metals such as gold (Au), silver (Ag), aluminum (Al), molybdenum (Mo), chromium (Cr), titanium (Ti), nickel (Ni), neodymium (Nd), and copper (Cu), or alloys thereof. In addition, the gate electrode GE may be formed in a single layer or in multiple layers in which two or more materials among the metals and the alloys are stacked.

An interlayer insulating layer IL is provided over the gate electrode GE. The interlayer insulating layer IL may be an inorganic insulating layer made of an inorganic material. The inorganic material may include polysiloxane, silicon nitride, silicon oxide, silicon oxynitride, and/or the like.

The source electrode SE and the drain electrode DE are provided on the interlayer insulating layer IL. The source electrode SE and the drain electrode DE may be in contact with the source region and the drain region of the active pattern ACT through contact holes formed in the interlayer insulating layer IL and the gate insulating layer GI, respectively.

Each of the source electrode SE and the drain electrode DE are made of a metal. For example, each of the source electrode SE and the drain electrode DE may be made of at least one of metals such as gold (Au), silver (Ag), aluminum (Al), molybdenum (Mo), chromium (Cr), titanium (Ti), nickel (Ni), neodymium (Nd), and copper (Cu), or alloys thereof In addition, each of the source electrode SE and the drain electrode DE may be formed in a single layer or in is multiple layers in which two or more materials among the metals and the alloys are stacked.

A passivation layer PSV may be provided over the source electrode SE and the drain electrode DE. The passivation layer PSV may include an inorganic material and/or an organic material. The inorganic material may include $SiO_2$, $SiN_x$, SiON, $Al_2O_3$, $TiO_2$, $Ta_2O_5$, $HfO_2$, $ZrO_2$, barium strontium titanate (BST), lead zirconate titanate (PZT), siloxane-based polymer, and the like. The organic material may include poly(methyl methacrylate) (PMMA), polystyrene (PS), polymer derivatives containing a phenol group, an acryl-based polymer, an imide-based polymer, an aryl ether-based polymer, an amide-based polymer, a fluorine-based polymer, a p-xylene-based polymer, a vinyl alcohol-based polymer, blends thereof, and the like. The passivation layer PSV may be formed in a complex stack structure including an inorganic material and/or an organic material.

A first electrode EL1 may be provided on the passivation layer PSV. The first electrode EL1 is connected to the drain electrode DE through a contact hole CH passing through s the passivation layer PSV, to be connected to the thin film transistor TFT. The first electrode EL1 may be used as one of an anode and a cathode.

The first electrode EL1 may be made of a metal layer including Ag, Mg, Al, Pt, Pd, Au, Ni, Nd, Ir, Cr, and alloys thereof and/or a transparent conductive layer including tin oxide (ITO), indium zinc oxide (IZO), zinc oxide ZnO, and indium tin zinc oxide (ITZO).

The first electrode EL1 may be made of one kind of metal or of an alloy of two or more kinds of metals, for example, Ag and Mg.

When an image is to be provided at the lower section of the substrate SUB, the first electrode EL1 may be formed of a transparent conductive layer. When an image is to be provided at the upper section of the substrate SUB, the first electrode EL1 may be formed of a metal reflective layer and/or a transparent conductive layer.

A pixel defining layer PDL defining a pixel region corresponding to each pixel is provided on the substrate SUB on which the first electrode EL1 and the like are formed. The pixel defining layer PDL may be an organic insulating layer made of an organic material. The organic material may include organic insulating materials such as a polyacryl-based compound, a polyimide-based compound, a fluorine-based compound like Teflon, a benzocyclobutene-based compound, and the like.

The pixel defining layer PDL exposes a top surface of the first electrode EL1 therethrough, and protrudes from the substrate SUB along the circumference of the pixel.

An emitting layer EML may be provided at a portion surrounded by the pixel defining layer PDL.

The emitting layer EML may include a low-molecular or high-molecular material. The low-molecular material may include copper phthalocyanine (CuPc), N,N'-Di(naphthalene-1-yl)-N,N'-diphenyl-benzidine (NPB), tris-8-hydroxy-quinoline aluminum ($Alq_3$), and the like. The high-molecular material may include poly(3,4-ethylenedioxythiophene (PEDOT)-, poly(phenylene-vinylene) (PPV)-, poly(fluorine)-based materials.

The emitting layer EML may be formed in a single layer, but may be formed in multiple layers including various functional layers. When the emitting layer EML is formed in multiple layers, the emitting layer EML may have a structure in which a hole injection layer, a hole transport layer, an emission layer, an electron transport layer, an electron injection layer, and the like are stacked in a single or complex structure. It should be apparent that the emitting layer EML is not limited thereto and may have various other forms or structures. In addition, at least a portion of the emitting layer EML may be integrally formed throughout a plurality of first is electrodes EL1 and may be individually provided to correspond to each of the plurality of first electrodes EL1.

A second electrode EL2 may be provided on the emitting layer EML. The second electrode EL2 may be provided for every pixel. However, the second electrode EL2 may alternatively be provided to cover a majority of the display area DA. Or, the second electrode EL2 may be shared by a plurality of pixels.

In some embodiments, the second electrode EL2 may be used as one of an anode and a cathode. When the first electrode EL1 is an anode, the second electrode EL2 may be used as a cathode. When the first electrode EL1 is a cathode, the second electrode EL2 may be used as an anode.

The second electrode EL2 may be made of a metal layer including Ag, Mg, Al, Pt, Pd, Au, Ni, Nd, Ir, Cr, and alloys thereof and/or a transparent conductive layer including tin oxide (ITO), indium zinc oxide (IZO), zinc oxide ZnO, and indium tin zinc oxide (ITZO). The second electrode EL2 may be formed in two or more layers including a metal thin film. For example, the second electrode EL2 may be formed in triple layers of ITO/Ag/ITO.

Referring back to FIGS. 2 and 3, the cover layer CVL protecting the pixel part PXP is provided on the second electrode EL2. The cover layer CVL includes a capping layer CPL and a mid-layer ML, which are sequentially stacked.

The capping layer CPL prevents the pixel part PXP, particularly, the emitting layer EML from being deteriorated, and may include an inorganic material and/or an organic material. The inorganic material may include silicon nitride, silicon oxide, silicon oxynitride, aluminum oxide, aluminum nitride, titanium oxide, titanium nitride, and the like. The organic material may include polyimide, polyester, polyacrly, and the like.

The mid-layer ML may be made of a material having excellent cohesive strength with the capping layer CPL and the first encapsulation layer SL1 which will be described later. For example, the capping layer CPL may include at least one of alkali metal salt and alkali earth metal salt. Specifically, the capping layer CPL may include at least one of lithium fluoride (LiF), calcium fluoride ($CaF_2$), magnesium chloride ($MgCl_2$), and sodium chloride (NaCl).

At least a portion of the cover layer CVL may be omitted. For example, both of the capping layer CPL and the mid-layer ML may be omitted, or one of the capping layer CPL and the mid-layer ML may be omitted.

The first encapsulation layer SL1 is provided over the mid-layer ML. The first encapsulation layer SL1 is used to protect the pixel part PXP and block entry of impurities from the outside. The first encapsulation layer SL1 may be provided in a shape completely covering the pixel part PXP. That is, the first encapsulation layer SL1 completely covers the display area DA in which the pixel part PXP is provided and extends to the non-display area NDA except an edge area of the substrate SUB to cover a portion of the non-display area NDA. If a portion of the non-display area NDA in which the first encapsulation layer SL1 is provided is a first area A1, and the rest of the non-display area NDA in which the first encapsulation layer SL1 is not provided is a second area A2, the second area A2 corresponds to an edge of the substrate SUB. When viewed in plan, the second area A2 is disposed at the periphery of the first area A1.

Accordingly, a portion of the first encapsulation layer SL1, which extends to the non-display area NDA is directly disposed on the substrate SUB. When the buffer layer BFL is not provided, the portion of the first encapsulation layer SL1 may be in direct contact with the substrate SUB. When the buffer layer BFL is provided, the portion of the first encapsulation layer SL1 may be in direct contact with the buffer layer BFL.

The first encapsulation layer SL1 may include an inorganic material and/or an organic material. The inorganic material or the organic material is not particularly limited. For example, the inorganic material may include silicon nitride, silicon oxide, silicon oxynitride, aluminum oxide, aluminum nitride, titanium oxide, titanium nitride, and the like. The organic material may include polyimide, polyester, polyacryl, polyurethane, and the like.

When the first encapsulation layer SL1 is provided as an inorganic insulating layer including an inorganic material, a material that is moisture resistant or moisture proof, such as $SiN_x$, $Al_2O_3$, $SiO_2$, or $TiO_2$, may be used to reduce or prevent penetration of moisture or oxygen from the outside. When the first encapsulation layer SL1 is provided as an organic insulation layer including an organic material, a material having high flexibility, such as polyacryl, may be used. Accordingly, damage or defects in the display panel DP can be reduced or prevented by reducing stresses acting thereon. For example, an internal stress that may occur in the display panel DP when it is rolled may be reduced or prevented. This will described in greater detail below. In FIG. 2, the first encapsulation layer SL1 is formed in a single layer, but the first encapsulation layer SL1 may alternatively be provided in multiple layers.

The second encapsulation layer SL2 is provided over the first encapsulation layer SL1 and completely covers the first encapsulation layer SL1. Since the second encapsulation layer SL2 covers both of the non-display area NDA and the display area DA, the second encapsulation layer SL2 is provided on the entire surface of the substrate SUB. That is, the second encapsulation layer SL2 covers all of the display area DA and the first and second areas A1 and A2 of the non-display area NDA. The second encapsulation layer SL2 is provided on the first encapsulation layer SL1 in the display area DA. The second encapsulation layer SL2 is provided on the first encapsulation layer SL1 in the first area A1 of the non-display area NDA. The second encapsulation layer SL2 is provided on the substrate SUB, specifically, the buffer layer BFL in the second area A2 of the non-display area NDA.

The second encapsulation layer SL2 reduces or prevents damage of the first encapsulation layer SL1, the cover layer CVL, the pixel part PXP, and the substrate SUB, caused by the stress applied to the display panel DP, and includes a material having a relatively high ductility and toughness. When the display panel DP is rolled or bent, a compressive stress and a tensile stress, caused by an external force, are applied to the display panel DP, but the second encapsulation layer SL2 reduces the transmission of those stresses to the display panel by absorbing at least a portion of the stress caused by the application of the external force.

The second encapsulation layer SL2 includes an interpenetrating polymer hydrogel. The interpenetrating polymer hydrogel has a higher elasticity and toughness than the other materials in the layers of the display device. Thus, an internal stress applied to the pixel part PXP and the like under the interpenetrating polymer hydrogel is reduced even when a force is applied to the display panel DP from the outside. The toughness represents the degree to which damage of the display panel DP, caused by an impact, is reduced. Expressed in a quantifiable numerical manner, the interpenetrating polymer hydrogel may have a toughness of about 5000 $J/m^2$ to about 12000 $J/m^2$.

Figure 4:
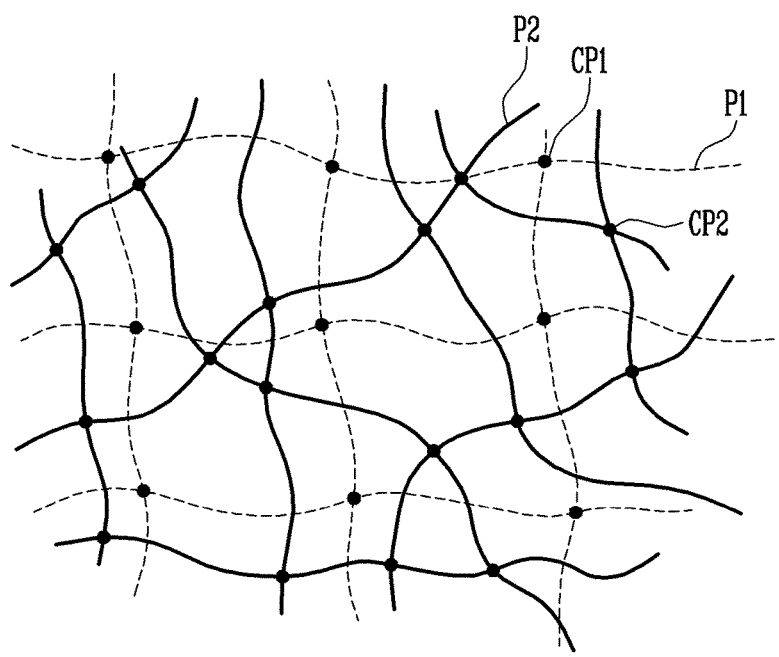
FIG. 4 is a schematic view conceptually illustrating an interpenetrating polymer network used in a display device constructed according to the principles of the invention.

Referring to FIG. 4, the interpenetrating polymer hydrogel has a structure in which a network composed of first polymers P1 and a network composed of second polymers P2 are physically entangled with each other. The first polymers P1 may be formed by polymerizing a monomer to interconnect a first cross-linking point CP1, and the second polymers P2 may be formed by polymerizing a monomer to interconnect at a second cross-linking point CP2.

The interpenetrating polymer hydrogel has improved mobility of polymer chains, as compared with some other polymers, and thus the flexibility of the interpenetrating polymer hydrogel is improved as compared thereto.

The interpenetrating polymer hydrogel may be provided in which two polymers are physically entangled with each other. Here, the two polymers are selected from polyethylene glycol (PEG), neopentylglycol diacrylate (NPGDA), polyethylene oxide (PEO), polyacrylamide (PAAM), polyhydroxyethylmethacrylate (PHEMA), polyacrylic acid (PAA), polyvinyl alcohol (PVA), poly(N-isopropylacrylamide) (PNIPAM), polyvinylpyrrolidone (PVP), polylactic acid (PLA), polyglycolic acid (PGA) and polycaprolactone (PCL), gelatin, alginate, carrageenan, chitosan, hydroxyalkyl cellulose, alkyl cellulose, silicone, rubber, agar, carboxyvinyl copolymer, polydioxolane, polyacrylacetate, polyvinylchloride, and maleic anhydride/vinylether.

The interpenetrating polymer hydrogel may particularly include polyacrylamide and alginate as the two polymers. The interpenetrating polymer hydrogel composed of polyacrylamide and alginate may have a toughness of about 9000 $J/m^2$.

The second encapsulation layer SL2 may completely cover the pixel part PXP and the first encapsulation layer SL1, so that the pixel part PXP can be protected, and simultaneously, the flexibility of the display panel DP can be increased. In addition, the damaging effects of an impact from the outside can be reduced or eliminated by the presence of the second encapsulation layer SL2.

The first connection layer CNL1 is provided between the first encapsulation layer SL1 and the second encapsulation layer SL2. The first connection layer CNL1 connects the first encapsulation layer SL1 and the second encapsulation layer SL2. Specifically, the first connection layer CNL1 serves as an adhesive that allows the first encapsulation layer SL1 and the second encapsulation layer SL2 to adhere to each other.

The first connection layer CNL1 is provided under the second encapsulation layer SL2. When viewed in plan, the connection layer CNL1 may be provided in the same size and shape as the second encapsulation layer SL2 by overlapping with the area in which the second encapsulation layer SL2 is formed.

Accordingly, the first connection layer CNL1 may be provided in all of the display area DA and the first and second areas A1 and A2 of the non-display area NDA. Specifically, the first connection layer CNL1 is provided between the first encapsulation layer SL1 and the second encapsulation layer SL2 in the display area DA and the first area of the non-display area NDA. Also, the first connection layer CNL1 is provided between the substrate SUB and the second encapsulation layer SL2, specifically, between the buffer layer BFL and the second encapsulation layer SL2 in the second area A2 of the non-display area NDA.

The first connection layer CNL1 may be an adhesive having elasticity. The interfacial adhesion of the first connection layer CNL1 may be a minimum of about 1000 gf/in. A silicone adhesive having excellent adhesion to an organic material and/or an inorganic material may be used as the first connection layer CNL1. The silicone adhesive may include organopolysiloxane. The adhesive including the organopolysiloxane may have both an organic part and an inorganic part in a relatively high molecular weight. Thus, the adhesive can relatively stably adhere to both an interface with an inorganic material and an interface with an organic material. A polymer using 3-trimethoxysilylpropyl methacrylate (TMSPMA) as a monomer may be used as an elastic adhesive of the first connection layer CNL1.

Figure 5A:
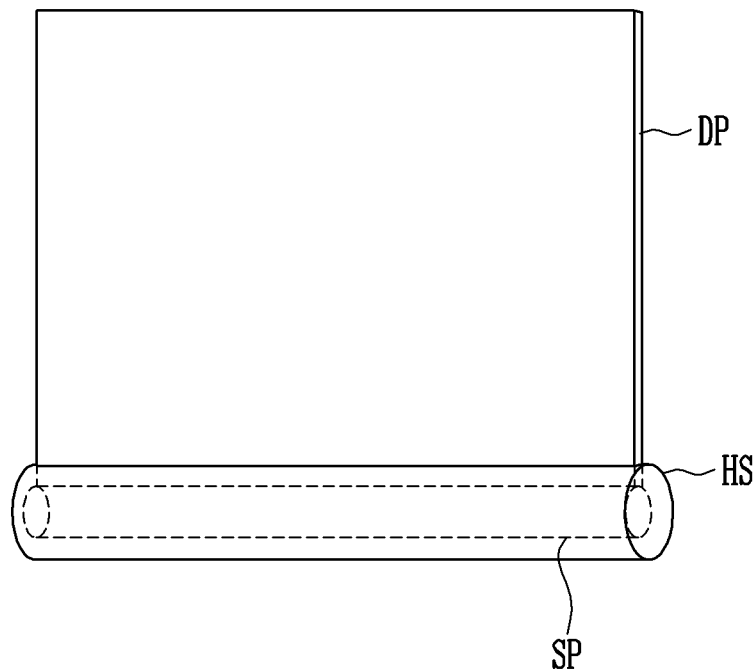
FIG. 5A is a schematic perspective view of a rollable display device constructed according to the principles of the invention in an unrolled state.
Figure 5B:
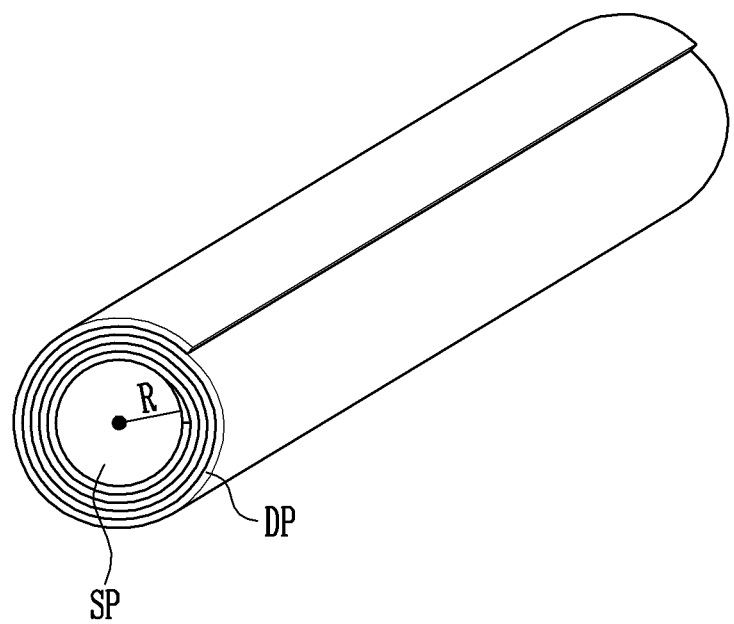
FIG. 5B is a schematic perspective view of the rollable display device of FIG. 5A in a fully rolled state.
Figure 5C:
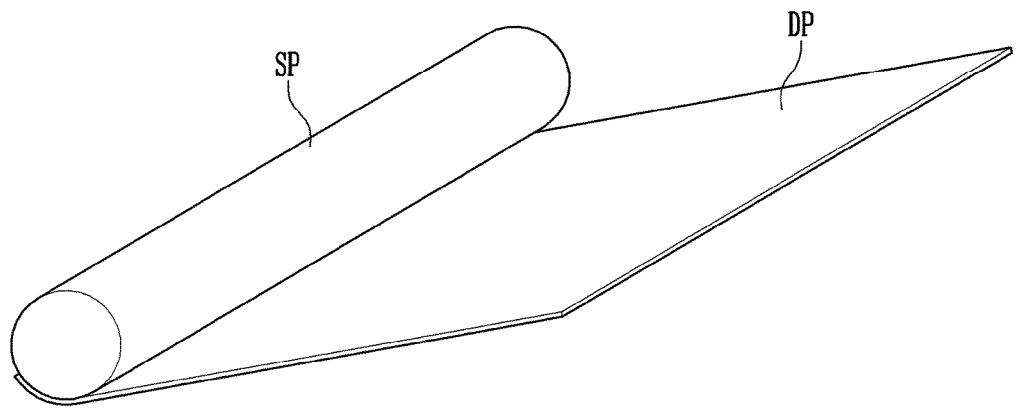
FIG. 5C is a schematic perspective view of the rollable display device of FIG. 5A in a partially rolled state.

Referring to FIGS. 5A to 5C, the rollable display device is operable in a rolled state, in an unrolled state, and in a partially rolled state.

Referring to FIG. 5A, the rollable display device may include a display panel DP having flexibility, the display panel DP being rollable, a supporting part SP supporting the display panel DP such that the display panel DP is rollable, and a housing HS accommodating the display panel DP and the supporting part SP therein.

The supporting part SP may be provided in a cylindrical shape having a predetermined radius R such that, when the display panel DP is rolled, the display panel DP is rolled with a predetermined radius of curvature. The display panel DP may be rolled around the outer surface of the supporting part SP, and the radius of curvature may be determined according to the radius R of the supporting part SP. When the display panel DP is rolled around the supporting part SP, the display panel DP may be rolled such that an image is displayed in the direction of the center of curvature. However, the display panel DP may be rolled such that an image is displayed in an outer direction opposite to the center of curvature. When the display panel DP is relatively stably rollable, the support part SP may have another shape, or may be omitted.

The supporting part SP may include a driving part (e.g., a motor) that allows the display panel DP to be rolled or unrolled. By the driving part, the display panel DP may be rotated to be in the unrolled state from the rolled state or to be in the rolled state from the unrolled state.

The housing HS may be provided with a sufficient size such that the display panel DP is rolled and then accommodated therein. The housing HS protects the display panel DP from an impact from the outside. An opening through which the display panel DP can be taken out of the housing HS may be provided in one side of the housing HS.

Referring to FIG. 5B, a state in which the display panel DP is rolled around the supporting part SP has been illustrated. When the display panel DP is rolled, the exposed area of the display device is decreased, and hence the display device is relatively more easily portable.

Referring to FIG. 5C, a state in which the display panel DP is mostly unrolled has been illustrated. One side of the display panel DP is held by the supporting part SP, and the remaining portion of the display panel DP is in a state in which the display panel DP is unrolled flat. In this case, the display area DA can be exposed to a user, and the user can view an image of the display area DA.

In the display device having the display panel DP, configured as described above, the separation of an encapsulation layer is reduced or prevented when the display device is rolled or folded.

In general, when a display device is rolled or folded, stress caused by a difference in shear strain between an inner radius of curvature and an outer radius of curvature is concentrated at an end portion of the display device. In a typical display device, an encapsulation layer has weak interfacial adhesion between a pixel part and the encapsulation layer. Hence, when the display device is rolled or folded, the encapsulation layer is separated from the pixel part at an edge portion of a substrate, particularly, a portion corresponding to a non-display area.

However, as described herein, the second encapsulation layer SL2 is formed over the first encapsulation layer SL1 to preferably completely cover the first encapsulation layer SL1. Thus, the second encapsulation layer SL2 can reduce or prevent damage caused by a stress that may be generated when the display device is rolled from that stress being transmitted to the first encapsulation layer SL1 or the pixel part PXP thereunder. Accordingly, the separation of each layer can be reduced or prevented.

Particularly, since the first connection layer CNL1 having elasticity is provided between the first encapsulation layer SL1 and the second encapsulation layer SL2, the first connection layer CNL1 can also reduce or prevent interface separation between the pixel part PXP and the encapsulation layer, caused by an external stress.

The display panel may have various structures according to the inventive concepts. Elements different from those described above will be mainly described below to avoid redundancy. Undescribed elements below should be understood to be the same as the description of the same element above.

Figure 6:
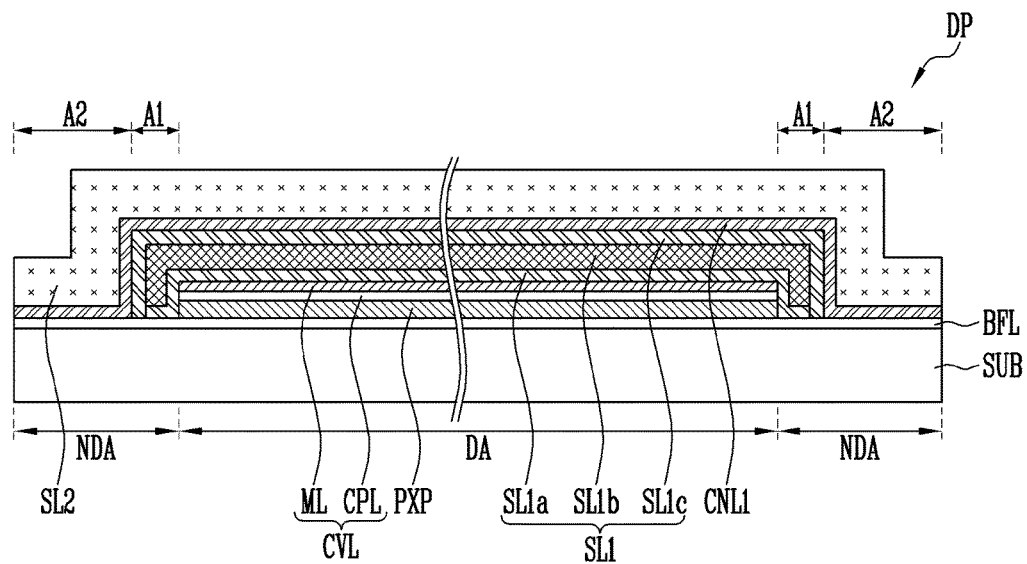
FIG. 6 is a cross sectional view of a second embodiment of a display panel constructed according to the principles of the invention.

Referring to the embodiment of FIG. 6, the first encapsulation layer SL1 for encapsulating the pixel part PXP may be provided in multiple layers.

In particular, the first encapsulation layer SL1 may be provided in three layers. Hence, the first encapsulation layer SL1 may include a first sub-layer SL1a, a second sub-layer SL1b, and a third sub-layer SL1c, which are sequentially provided over the cover layer CVL. The first sub-layer SL1a may be made of an inorganic material, the second sub-layer SL1b may be made of an organic material or an inorganic material, and the third sub-layer SL1c may be made of an inorganic material. As compared with the organic material, moisture or oxygen penetrates into the inorganic material less, but the inorganic material is more vulnerable to cracks due to its elasticity or flexibility tending to be less than that of an organic material. The inventors have further discovered that, where the first sub-layer SL1a and the third sub-layer SL1c are formed of an inorganic material, and the second sub-layer SL1b is formed of an organic material, the propagation of cracks can be reduced or prevented as compared to an embodiment having only inorganic material(s).

The organic material may include a polyacryl-based compound, a polyimide-based compound, a fluorine-based compound such as Teflon, a benzocyclobutene-based compound, and the like. The inorganic material may include polysiloxane, silicon nitride, silicon oxide, silicon oxynitride, and the like. The inorganic material may include various silicon-based insulating materials, e.g., hexamethyldisiloxane (HMDSO), octamethylcyclotetrasiloxane (OMCTSO), tetramethyldisiloxane (TMDSO), tetraethyleorthosilicate (TEOS), and the like.

In the case of insulating layers made of an organic material, the insulating layers are advantageous in terms of flexibility, elasticity, and so on, but moisture or oxygen easily penetrates into the insulation layers, as compared with insulating layers made of an inorganic material. In order to prevent moisture or oxygen from penetrating into the second sub-layer SL1b, an end portion of the second sub-layer SL1b, particularly, a side end portion may be completely covered by the third sub-layer SL1c not to be exposed to the outside.

The first encapsulation layer SL1 may be provided in a form other than three layers stacked in the order of the inorganic material, the organic material, and the inorganic material. For example, the first encapsulation layer SL1 may be provided in four or more layers, or may be provided in any number of organic layers and inorganic layers, which are alternately stacked. When the first encapsulation layer SL1 is provided in multiple layers including organic and inorganic layers, the uppermost layer of the first encapsulation layer SL1 may be an inorganic layer, and the inorganic layer may cover all of the layers provided thereunder.

Figure 7:
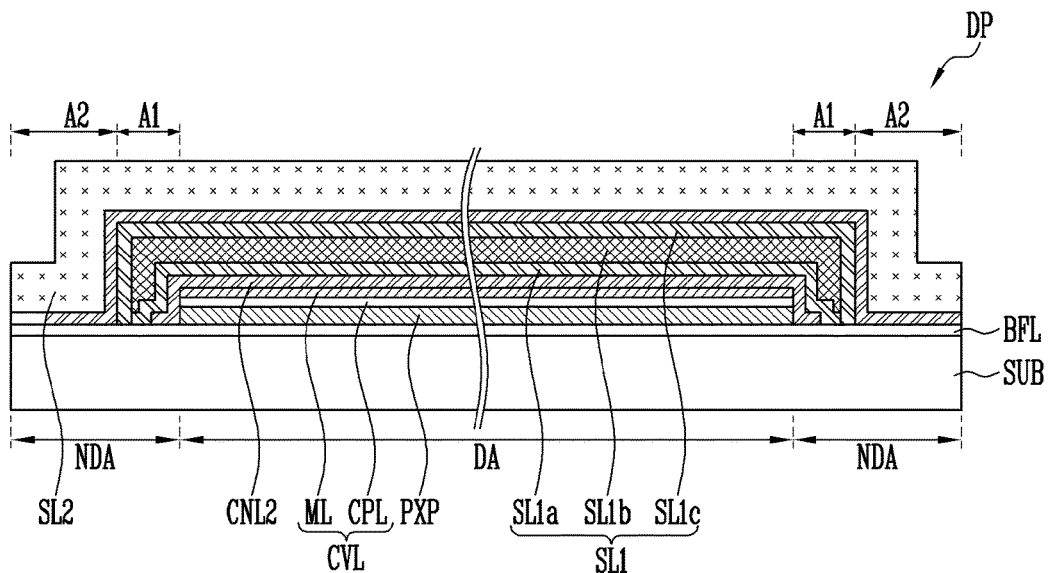
FIG. 7 is a cross sectional view of a third embodiment of a display panel constructed according to the principles of the invention.

Referring to the embodiment of FIG. 7, the display panel DP may further include an additional connection layer to have additional adhesion between components in the device and additional stiffness to resist damage caused by stress. Hence, a second connection layer CNL2 may be provided between the pixel part PXP and the first encapsulation layer SL1, and, more specifically, between the cover layer CVL and the first encapsulation layer SL1.

The second connection layer CNL2 connects the cover layer CVL and the first encapsulation layer SL1. Specifically, the second connection layer CNL2 serves as an adhesive that allows the cover layer CVL and the first encapsulation layer SL1 to adhere to each other.

The second connection layer CNL2 may be an adhesive having elasticity. Particularly, a silicone adhesive having sufficient adhesion to an organic material and/or an inorganic material may be used as the second connection layer CNL2. The silicone adhesive may include organopolysiloxane. A polymer using 3-trimethoxysilylpropyl methacrylate (TMSPMA) as a monomer may be used as an elastic adhesive of the second connection layer CNL2.

As the second connection layer CNL2 is provided between the cover layer CVL and the first encapsulation layer SL1, cohesive strength between the cover layer CVL and the first encapsulation layer SL1 is thereby increased, and the stress applied when the display panel DP is rolled, flexed or folded is reduced, so that separation between the pixel part PXP and the first encapsulation layer SL1 can be reduced or prevented.

Figure 8:
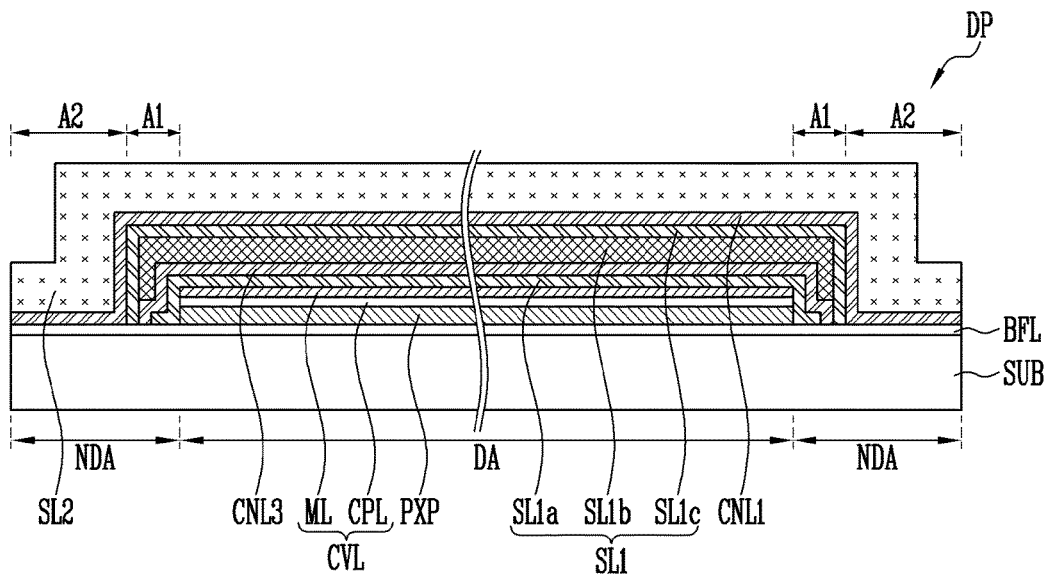
FIG. 8 is a cross sectional view of a fourth embodiment of a display panel constructed according to the principles of the invention.

Referring to the embodiment of FIG. 8, the display panel DP may further include yet another connection layer to have adhesion between still further components in the device and still further stiffness against damage caused by the forces of stress. Hence, a third connection layer CNL3 may be provided in the first encapsulation layer SL1. Specifically, when the first encapsulation layer SL1 includes a first sub-layer SL1a, a second sub-layer SL1b, and a third sub-layer SL1c, the third connection layer CNL3 may be provided between the first sub-layer SL1a and the second sub-layer SL1b and/or between the second sub-layer SL1b and the third sub-layer SL1c. The third connection layer CNL3 serves as an adhesive that better adheres the respective layers to each other.

The third connection layer CNL3 may be an adhesive having elasticity. Particularly, a silicone adhesive having excellent adhesion to an organic material and/or an inorganic material may be used as the third connection layer CNL3. The silicone adhesive may include organopolysiloxane. A polymer using 3-trimethoxysilylpropyl methacrylate (TMSPMA) as a monomer may be used as an elastic adhesive of the third connection layer CNL3.

As the third connection layer CNL3 is provided within the first encapsulation layer SL1, cohesive strength between the sub-layers in the first encapsulation layer SL1 is thereby increased, and the stress applied to those elements when the display panel DP is rolled, flexed or folded is reduced, so that damage of the pixel part PXP can be reduced or prevented.

While the disclosure has been described in connection with exemplary embodiments, it will be understood by those skilled in the art that various modifications and changes can be made thereto without departing from the spirit and scope of the disclosure defined by the appended claims. For example, the respective embodiments of the disclosure have been proposed to have different structures, but it will be apparent that components may have forms in which the features of various ones of the above embodiments are combined or replaced with one another as long as they are not incompatible. In the case of a material (e.g., an organic or inorganic material) constituting each layer, the material is not limited to the materials listed above, and materials of the respective embodiments may have forms in which they are combined or replaced with one another as long as they are not incompatible.

The display panel configured as described above may be used in various types of products. For example, the display panel may be used in mobile devices, smart phones, electronic books, laptop computers, notebook computers, tablet computers, personal computers, advertising panels, and the like, or in some other sort of product.

According to the disclosure, it is possible to reduce or eliminate damage in a display device when it is rolled, flexed or folded and thereby to improve the reliability of the display device.

Although certain exemplary embodiments and implementations have been described herein, other embodiments and modifications will be apparent from this description. Accordingly, the inventive concepts are not limited to such embodiments, but rather to the broader scope of the presented claims and various obvious modifications and equivalent arrangements.

What is claimed is:

1. A display device comprising:
   a substrate including a display area and a non-display area;
   a pixel part in the display area of the substrate to display an image;
   a first encapsulation layer disposed over and covering at least part of the pixel part; and
   a second encapsulation layer disposed over the first encapsulation layer and substantially covering the entire extent of the first encapsulation layer,
   wherein:
   the second encapsulation layer comprises an interpenetrating polymer hydrogel; and
   the first encapsulation layer includes a first sub-layer having an inorganic material, a second sub-layer having an organic material, and a third sub-layer having an inorganic material, which sub-layers are sequentially stacked.

2. The display device of claim 1, wherein the interpenetrating polymer hydrogel includes at least two of polyethylene glycol, neopentylglycol diacrylate, polyethylene oxide, polyacrylamide, polyhydroxyethylmethacrylate, polyacrylic acid, polyvinyl alcohol, poly(N-isopropylacrylamide), polyvinylpyrrolidone, polylactic acid, polyglycolic acid and polycaprolactone, gelatin, alginate, carrageenan, chitosan, hydroxyalkyl cellulose, alkyl cellulose, silicone, rubber, agar, carboxyvinyl copolymer, polydioxolane, polyacrylacetate, polyvinylchloride, and maleic anhydride/vinylether.

3. The display device of claim 2, wherein the interpenetrating polymer hydrogel comprises polyacrylamide and alginate.

4. The display device of claim 1, further comprising a first connection layer disposed between the first encapsulation layer and the second encapsulation layer, the first connection layer connecting the first encapsulation layer and the second encapsulation layer together.

5. The display device of claim 4, wherein the non-display area includes a first area in which the first encapsulation layer is disposed and a second area in which the first encapsulation layer is not disposed, and
   wherein the first connection layer is disposed between the substrate and the second encapsulation layer in the second area.

6. The display device of claim 5, wherein the substrate has opposed faces and the second encapsulation layer extends over substantially the entire surface of one of the faces of the substrate.

7. The display device of claim 5, wherein the first connection layer overlaps with the second encapsulation layer and has substantially the same size and shape as the second encapsulation layer.

8. The display device of claim 5, wherein the first connection layer comprises an elastic adhesive.

9. The display device of claim 8, wherein the elastic adhesive comprises organopolysiloxane.

10. The display device of claim 9, wherein the organopolysiloxane comprises a polymer polymerized by 3-trimethoxysilylpropyl methacrylate as a monomer.

11. The display device of claim 4, further comprising a buffer layer disposed between the substrate and the first connection layer.

12. The display device of claim 11, further comprising a second connection layer disposed between the pixel part and the first encapsulation layer.

13. The display device of claim 1, further comprising a third connection layer provided between at least one of the first sub-layer and the second sub-layer or between the second sub-layer and the third sub-layer.

14. The display device of claim 1, wherein at least a portion of the display device has flexibility.

15. The display device of claim 14, wherein at least a portion of the display device is rollable.

16. The display device of claim 14, wherein at least a portion of the display device is foldable.

17. The display device of claim 1, wherein the pixel part comprises:
   a thin film transistor on the substrate; and
   a light emitting device connected to the thin film transistor.

18. The display device of claim 1, further comprising a mid-layer disposed between the pixel part and the first encapsulation layer, the mid-layer comprising at least one of alkali metal salt and alkali earth metal salt.

19. The display device of claim 1, wherein the interpenetrating polymer hydrogel has a toughness of about 5000 $J/m^2$ to about 12000 $J/m^2$.

20. The display device of claim 1, further comprising a cover layer disposed between the pixel part and the first encapsulation layer, wherein the cover layer protects the pixel part.

21. The display device of claim 20, wherein the cover layer comprises a capping layer and a mid-layer, which are sequentially stacked.

* * * * *